United States Patent
Pascucci

[11] Patent Number: 5,905,678
[45] Date of Patent: May 18, 1999

[54] CONTROL CIRCUIT OF AN OUTPUT BUFFER

[75] Inventor: Luigi Pascucci, Sesto San Giovanni, Italy

[73] Assignee: SGS-Thomson Microelectronics, S.r.l., Italy

[21] Appl. No.: 08/934,499

[22] Filed: Sep. 19, 1997

[30] Foreign Application Priority Data

Sep. 19, 1996 [EP] European Pat. Off. ............ 96830475

[51] Int. Cl.$^6$ .................................................. G11C 16/04
[52] U.S. Cl. ............................ 365/189.05; 365/230.02; 365/189.02; 365/194; 365/191
[58] Field of Search ............................... 365/238.5, 206, 365/189, 189.05, 230.02, 233, 189.02, 185.17, 194, 191

[56] References Cited

U.S. PATENT DOCUMENTS

| | | | |
|---|---|---|---|
| 4,825,410 | 4/1989 | Lee | 365/189 |
| 5,268,868 | 12/1993 | Kajigaya et al. | 365/206 |
| 5,307,317 | 4/1994 | Shiraishi et al. | 365/205 |
| 5,768,215 | 6/1998 | Kwon et al. | 365/238.5 |

FOREIGN PATENT DOCUMENTS

| | | |
|---|---|---|
| 0 473 127 | 3/1992 | European Pat. Off. . |
| 0 534 394 | 3/1993 | European Pat. Off. . |
| 0 624 878 | 11/1994 | European Pat. Off. . |
| 4 440 169 | 5/1995 | Germany . |

Primary Examiner—David Nelms
Assistant Examiner—Thong Le
Attorney, Agent, or Firm—Jenkens & Gilchrist, P.C.

[57] ABSTRACT

The invention relates to a control circuit for an output buffer, of the type which comprises a first input terminal receiving a first enable signal and a second input terminal receiving a second enable signal, as well as first and second output terminals to generate first and second partial enable signals to transfer discrete sets of data bits. The first and second input terminals are coupled to the first and second output terminals through a multiplexer. The control circuit includes a synchronization circuit for linking the partial enable signals operatively to a synchronization signal of the pulse type being synchronous with the loading of the output buffer. The synchronization circuit is connected between an output terminal of the multiplexer and the first and second output terminals of the control circuit.

16 Claims, 4 Drawing Sheets

CONTROL CIRCUIT OF AN OUTPUT BUFFER

FIELD OF THE INVENTION

This invention relates to a control circuit of an output buffer for, but not limited to, a non-volatile memory device.

BACKGROUND OF THE INVENTION

As is well known, non-volatile memory devices include two basic control terminals which receive a first enable signal, conventionally designated CE and a second enable signal, designated OE. In particular, the first signal CE enables the memory device operation, while the second signal OE enables its communication to internal or external circuitry.

The enable signals, CE and OE, are utilized, for example, to control output lines of memory devices through output buffers which are in a "tri-state" condition, that is a high impedance condition, regulated by the signal OE. In particular, the enable signals CE and OE are applied to such output buffers by specially provided control circuits.

As the enable signal OE assumes a low logic level, or 0 level, the control circuit drives the output buffer to the high impedance condition, thereby enabling the communication of external logics to internal circuitry of the memory device. Likewise, as the enable signal OE assumes a high logic level, or 1 level, the control circuit enables the output buffer to transmit to the outside of the memory device data stored in the inside.

The signal CE sets an operation interval of the memory device, for example to read data which is transferred to the output lines only during the checking of programmed data for correctness, in the course of a programming phase. Thus, the signal CE functions as a signal enabling the checking of programmed data.

Shown schematically in FIG. 1 is a control circuit 1' of an output buffer according to the prior art. The control circuit 1' includes first I1' and second I2' input terminals as well as first O1' and second O2' output terminals. In particular, the first input terminal I1' receives the inverse of the first enable signal $\overline{OE'}$ and the second input terminal I2' receives the inverse of the second enable signal $\overline{CE'}$.

The first input terminal I1' is further coupled to a first input terminal I3' of a multiplexer 2' through a first logic gate 3'. Likewise, the second input terminal I2' is coupled to a second input terminal I4' of the multiplexer 2', through a second logic gate 4'.

The multiplexer 2' has a further input terminal I5' receiving a control signal PG'. The multiplexer 2' also has an output terminal O3' which is coupled to both the first O1' and the second O2' output terminals of the control circuit 1', through respective first 5' and second 6' logic circuits.

The multiplexer 2' will choose between the first OE' and the second CE' enable signal according to the condition of operation of the memory device; that is, it will output the first enable signal OE' while reading of the memory device, the second enable signal CE' being only output during the memory device programming phase to enable the checking during the programming phase.

The first logic circuit 5' comprises substantially first IN1' and second IN2' logic inverters connected in series with each other between the output terminal O3' of the multiplexer 2' and the first output terminal O1' of the control circuit 1'.

The second logic circuit 6' similarly comprises a first logic gate PL1' with two inputs and of a third logic inverter IN3', connected in series with each other between the output terminal O3' of the multiplexer 2' and the second output terminal O2' of the control circuit 1'. In addition, said first logic gate PL1' receives a control signal WORD' at an input terminal I6'.

The first O1' and second O2' output terminals of the control circuit 1' supply first OE_L' and second OE_H' partial enable signals which are advantageously utilized to control the transfer of discrete sets of bits.

However, the enabling of the read data transfer to the output, as provided by either enable signals OE' and CE', has a response time which is shorter than the propagation time required to complete the reading, from the time the memory is activated, which results in a first random switching of the output stages followed by a second reading, now a consistent one with the memory contents. Thus, it would be desirable to have, at a first reading event, the activation of the output buffers delayed such that the switchings of the output signals cannot perturb the real data read-out process with unreliable switchings.

In fact, the sensitiveness to this undesired phenomenon is higher the more parallel the data, hence the need to have a synchronized enabling for the first read cycle so as to avoid penalties in terms of time. Once the first read cycle is synchronized, no further checking is necessary while the enable signal OE' is at the 0 level.

The underlying technical problem of the present invention is to provide a control circuit of an output buffer, in particular for a non-volatile memory device, which has such structural and functional features as to allow the delaying of just the first switching of the memory device output lines at the end of a true reading interval, thereby overcoming the drawbacks of prior art devices.

SUMMARY OF THE INVENTION

Accordingly, the present invention provides a control circuit which allows output buffers to transmit read data dependent on a "first reading event" regardless of the generation of an enable signal.

The present invention provides a control circuit for an output buffer comprising a first input terminal receiving a first enable signal and a second input terminal receiving a second enable signal. The control circuit further comprises first and second output terminals to generate first and second partial enable signals to transfer discrete sets of data bits. The first and second input terminals are coupled to the first and second output terminals through a multiplexer and a synchronization circuit for linking the partial enable signals operatively to a synchronization signal of the pulse type being synchronous with the loading of the output buffer. The synchronization circuit is connected between an output terminal of the multiplexer and the first and second output terminals of the control circuit.

The features and advantages of the control circuit according to the invention will be apparent from the following description of an embodiment thereof, given by way of non-limitative example with reference to the accompanying drawings.

DETAILED DESCRIPTION OF A PREFERRED EMBODIMENT OF THE INVENTION

Figure 2:
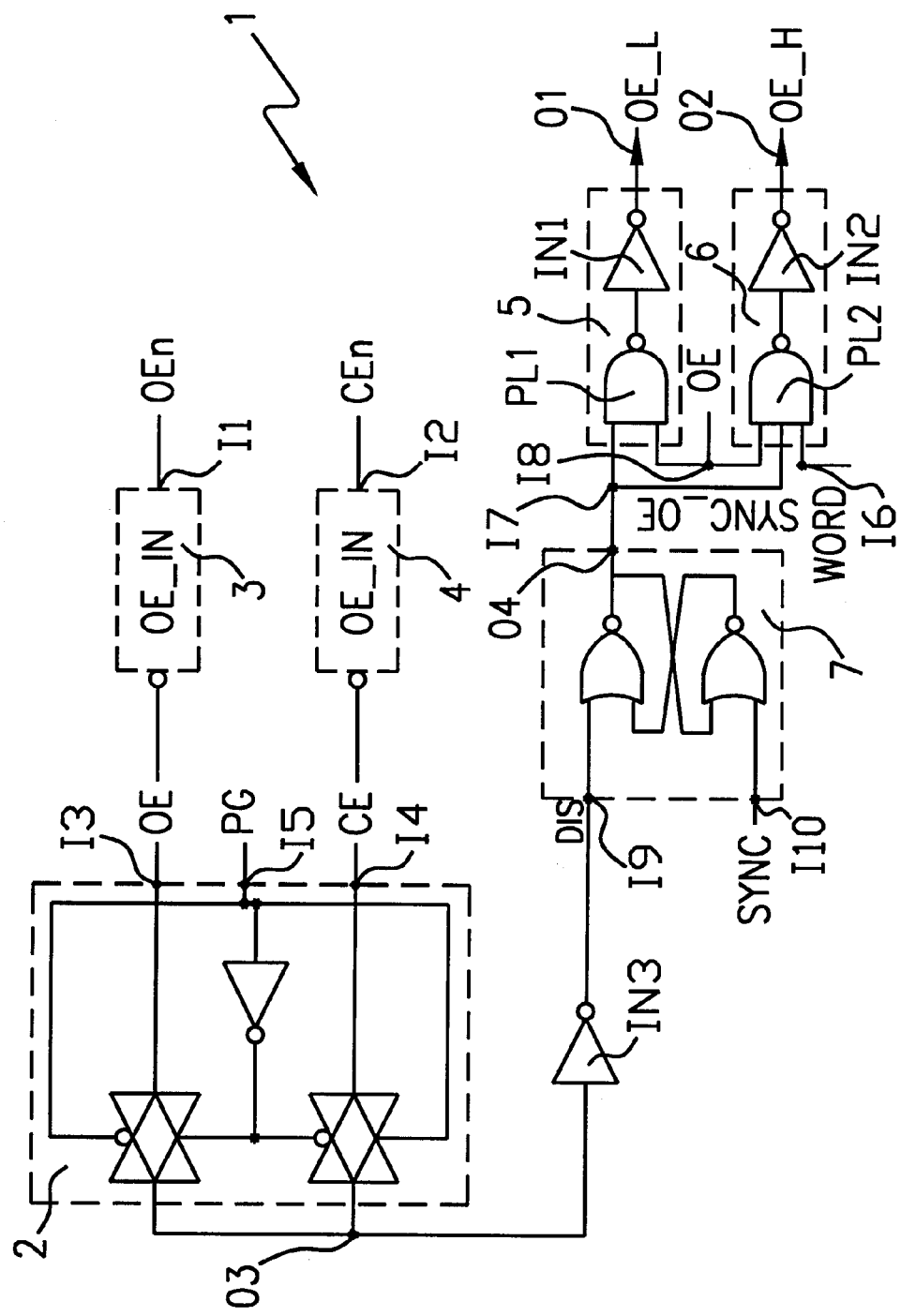
FIG. 2 shows schematically a control circuit for an output buffer, according to the present invention.

Referring to FIG. 2, generally and schematically shown at 1 is a control circuit for an output buffer, according to the present invention. The control circuit 1 includes first I1 and second I2 input terminals and first O1 and second O2 output terminals. In particular, the first input terminal I1 receives the inverse of a first enable signal $\overline{OE}$, and the second input terminal I2 receives the inverse of a second enable signal $\overline{CE}$.

Figure 1:
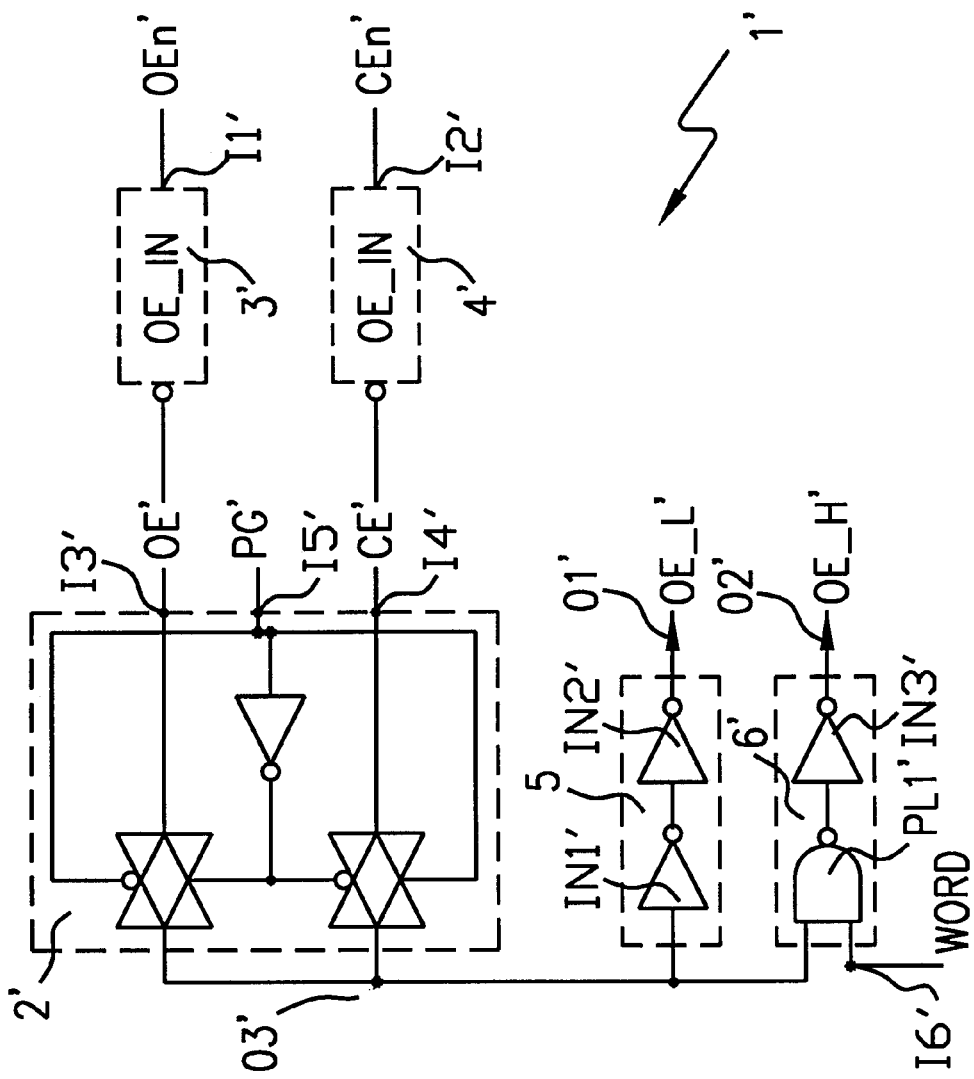
FIG. 1 shows schematically a control circuit for an output buffer, according to the prior art.

The circuit parts denoted by 2, 3 and 4 fully correspond to the circuit parts 2', 3' and 4' previously described with reference to FIG. 1 and the prior art control circuit 1'. In particular, the multiplexer 2 has a first input terminal I3 receiving the first enable signal OE through a first logic gate 3, a second input terminal I4 receiving the second enable signal CE through a second logic gate 4, and a further input terminal I5 receiving a control signal PG. The multiplexer 2 also has an output terminal O3 coupled to the first O1 and second O2 output terminals of the control circuit 1 through respective first 5 and second 6 logic circuits and a synchronization circuit 7.

In the example shown in FIG. 2, the first logic circuit 5 comprises a first logic gate PL1 with two inputs and a first logic inverter IN1 connected in series with each other between the output terminal O3 of the multiplexer 2 and the first output terminal O1 of the control circuit 1.

Likewise, the second logic circuit 6 comprises a second logic gate PL2 with three inputs and a second logic inverter IN2 connected in series with each other between the output terminal O3 of the multiplexer 2 and the second output terminal O2 of the control circuit 1. In addition, second logic gate PL2 receives a control signal WORD at another input terminal I6. The first PL1 and second PL2 logic gates have respective first I7 and second I8 input terminals in common. The second terminals I8 also receive the first enable signal OE.

In the embodiment shown in FIG. 2, the logic gates PL1 and PL2 are of the NAND type. In addition, the first O1 and second O2 output terminals of the control circuit 1 according to the invention supply first OE_L and second OE_H partial enable signals which are used to control the transfer of discrete sets of bits.

Advantageously according to the invention, the control circuit 1 also includes the synchronization circuit 7 connected to the output terminal O3 of the multiplexer 2 through a logic inverter IN3 and to the first common input terminal I7 of the logic circuits 5 and 6. More particularly, the synchronization circuit 7 has a first input terminal I9 which is connected to the logic inverter IN3 and receives a disable signal DIS. The synchronization circuit 7 also has a second input terminal I10 receiving a synchronization signal SYNC. Moreover, the circuit 7 has an output terminal O4 for supplying a synchronized enable signal SYNC_OE of the pulse type.

In the embodiment shown in FIG. 2, the synchronization circuit 7 simply comprises a flip-flop of the SET-RESET type.

The operation of the control circuit 1 according to the invention will now be described.

The synchronization circuit 7 allows the partial enable signals OE_L and OE_H to be generated only on completion of a reading event. The synchronization signal SYNC indicates the simultaneous loading of data into the output buffers. In fact, the synchronized enable signal SYNC_OE goes to a high logic level, or 1 level, only upon the synchronization signal SYNC going to a 1 level, indicating the loading of data into the output buffers, thereby delaying the switching of the memory device outputs on completion of the reading, even when the enable signal OE has already been produced.

It should be noted that the enable signal OE drives, to a low logic level or 0 level, the synchronization signal DIS, with no effects on propagation. On the other hand, as the enable signal OE goes to a 1 level, the synchronization signal DIS goes to a 0 level, thereby disabling the generation of the partial enable signals OE_L and OE_H and functioning, therefore, as a reset signal for the flip-flop 7. However, possible bouncing of the enable signal OE causes disabling of the partial enable signals OE_L and OE_H and a stepped signal pattern, thereby requiring filtering of the enable signal OE to prevent such from occurring.

Figure 5:
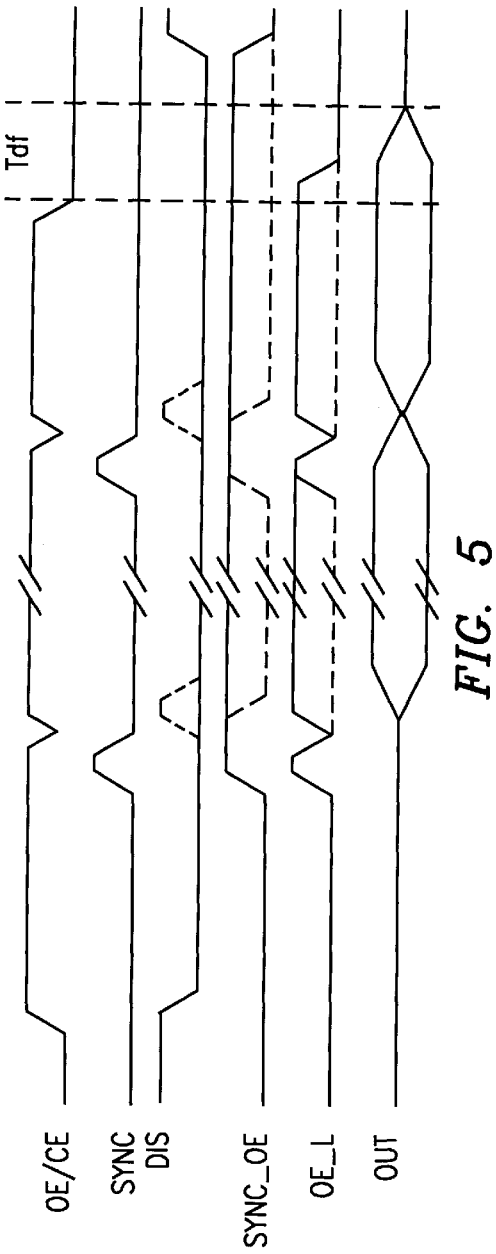
FIG. 5 shows waveforms on a common time base which illustrate the behavior of signals present in the circuit of FIG. 4 over time.

In the presence of the synchronization signal SYNC, the pattern sought for the output signal OUT is that shown in FIG. 5. Also, the disable pulse DIS should only be produced with the system disabled. Actually, the switching of the output lines may cause undesired pulses to appear in the pattern of the enable signals OE/CE which cause, in turn, incorrect pulses in the disable signal DIS. These incorrect pulses are shown by dash lines in FIG. 5.

In the presence of such incorrect pulses of the disable signal DIS, the synchronized enable signal SYNC_OE goes to ground erroneously, causing the whole system to become disabled, through the partial enable signals OE_L and OE_H which are blocking the output buffers.

Figure 3:
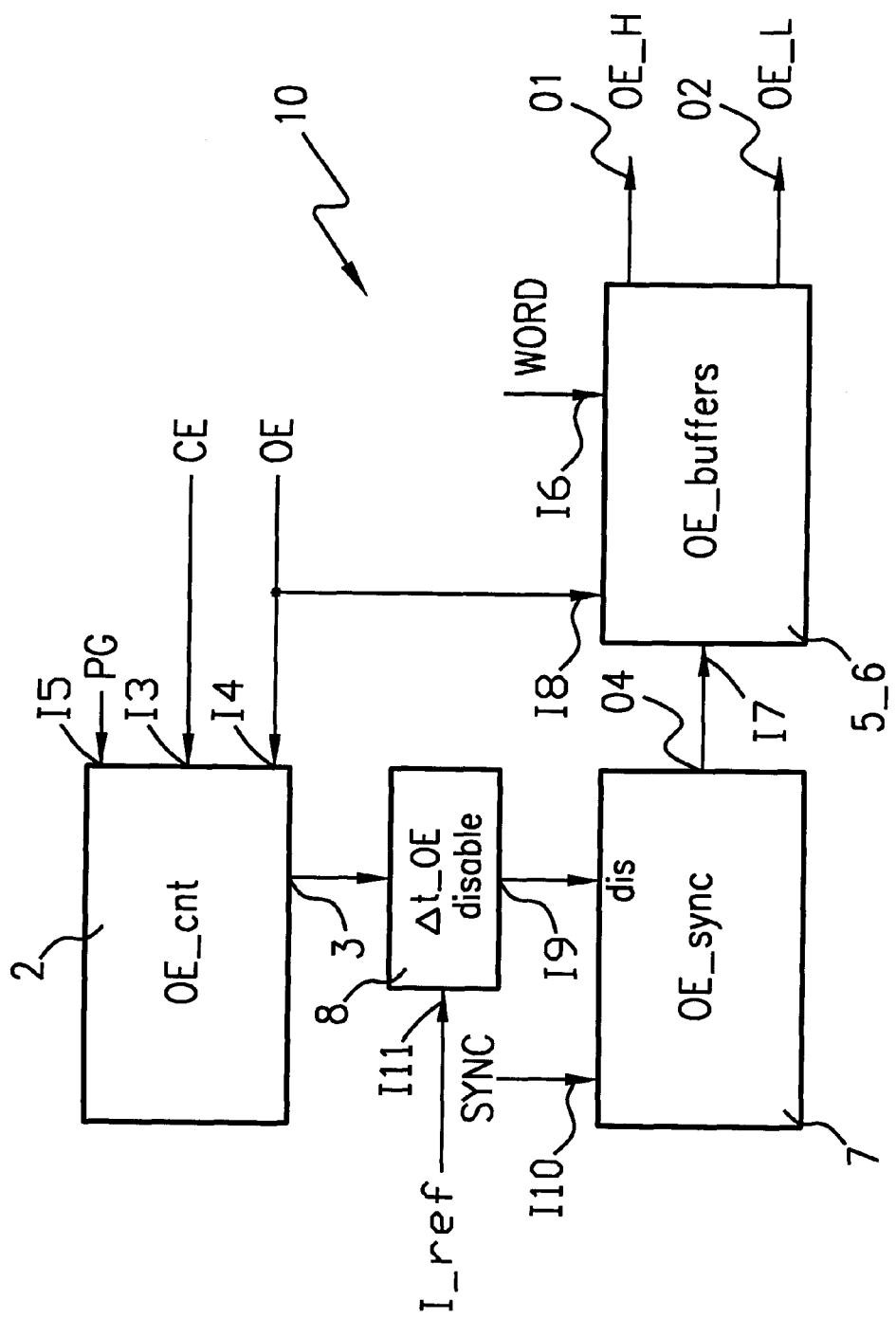
FIG. 3 shows schematically an improved embodiment of a control circuit of an output buffer, according to the present invention.

To obviate this drawback, in this invention, a delay circuit has been purposely provided for the disable signal DIS. This delay circuit is incorporated to a modified embodiment of the inventive control circuit shown schematically in FIG. 3.

Figure 4:
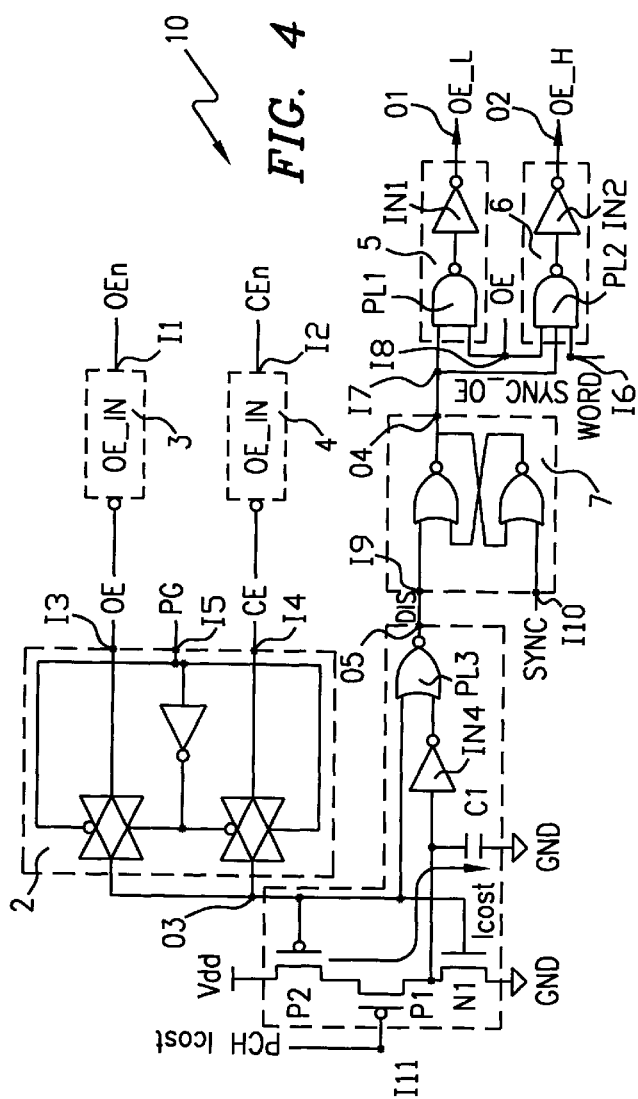
FIG. 4 shows in greater detail the structure of the control circuit according to the embodiment of FIG. 3.

In particular, generally shown at 10 is a control circuit with an asymmetrical delay circuit 8 connected between the multiplexer 2 and the synchronization circuit 7. The delay circuit 8, shown in detail in FIG. 4, is connected between a first supply voltage reference Vdd and a second voltage reference, in particular a signal ground GND, and connected to the output terminal O3 of the multiplexer 2 and to the input terminal I9 of the synchronization circuit 7. In addition, the delay circuit 8 has a control terminal I11 receiving a reference signal PCH_Icost and an output terminal O5 supplying a controlled disable signal DIS1 through the delay circuit 8.

For proper operation of the control circuit 10 according to this modification, the delay circuit 8 should include an asymmetrical delay network, having a significant delay from a first edge of the enable signal OE and immediate natural propagation at a second edge of that signal. More particularly, the delay circuit 8 comprises a charge control transistor P1 having a source terminal connected, through a first enable transistor P2, to the supply voltage reference Vdd, and a drain terminal connected to the ground GND through a parallel of a second enable transistor N1 and a delay capacitor C1. The charge control transistor P1 also has a gate terminal connected to the control terminal I11, while the enable transistors P2 and N1 have their gate terminals connected to the output terminal O3 of the multiplexer 2.

The reference signal PCH_Icost cannot control, independently from the power supply, the conductivity of P1 such that the charging of the capacitor C1 can take place in a constant manner independently from the power supply. In particular, the charge control transistor P1 and the first enable transistor P2 are P-channel MOS transistors, whereas the second enable transistor N1 is an N-channel MOS transistor.

The delay capacitor C1 is also connected to the input of a logic inverter IN4 which has its output connected to one input of a logic gate PL3, in particular a gate of the NOR type, having another input connected to the output terminal O3 of the multiplexer 2, and supplying the controlled disable signal DIS1 at its output terminal O5.

In this way, as the enable signal OE goes to a 1 level, the controlled disable signal DIS1 immediately goes to the 1 level, thereby allowing the enable signal OE to be propagated. On the other hand, as the enable signal OE goes to a 0 level, the controlled disable signal DIS1 goes to a 0 level only after the delay capacitor C1 is discharged. In fact, in the presence of a first edge, in particular a raising edge of the enable signal OE, the controlled disable signal DIS1 immediately (or rather, after a trivial delay due to the switching of the logical elements included in the delay circuit 8) goes to a low logic level, or 0 level.

Likewise, in the presence of a second edge, in particular a falling edge of the enable signal OE, the controlled disable signal DIS1 retains its 0 level until a charge current Icost, passing through the delay capacitor C1, brings the input of the logic inverter IN4 to a 1 level, and hence, the input of the logic gate PL3 to a 0 level, thus causing the output terminal O5 of the delay circuit 8 to go to a 1 level, and resetting the flip-flop 7.

The switching of the controlled disable signal DIS1 at the falling edge of the enable signal OE occurs with a delay Δt which allows the data reading cycle of the memory device to be completed. Advantageously according to the invention, this delay is proportional to the charge current Icost of the delay capacitor C1 and is, therefore, independent from the supply voltage Vdd.

The control circuit 10 with delay circuit 8 according to the invention is of special advantage at high voltage levels, when the presence of high levels of noise disallows the use of known delay circuits for which the delay is proportional to the supply voltage. Accordingly, to obtain a sufficiently delayed propagation to allow the use of such known delay circuits, at high levels of the supply voltage, it would be necessary to increase the basic delays provided thereby; however, this would entail unacceptable delays at lower voltage levels.

The operation of the delay circuit 8 incorporated to the control circuit 10 of this invention involves the use of a constant current generator capable of delivering a regulating signal PCH_Icost substantially constant with respect to the supply voltage Vdd.

To summarize, the control circuit 10 with delay circuit 8 according to this invention has immediate reaction features to the occurrence of a first reading cycle, and exhibits a delayed action from the disabling operation, thereby providing a filter action with respect to pulses of noisy origin.

In addition, by using a circuit with a delay which unvaries with respect to the supply voltage Vdd, the natural synchronized configuration in the various first read cycles, otherwise too slow for establishing at low voltages, can be promptly restored. In this way, the structures of the output buffers of memory devices operating at high voltages and equipped with this control circuit with delay can be safely increased in size to provide faster switchings, and accordingly, increased speed for the devices in their entirety.

Finally, the control circuit 1 and 10 of this invention can be used to synchronize the second enable signal CE, supplying it at the second common input terminal I8 of the logic circuits 5 and 6.

While the invention has been particularly shown and described with reference to specific embodiments thereof, it will be understood by those skilled in the art that various changes in form and detail may be made thereto, and that other embodiments of the present invention beyond embodiments specifically described herein may be made or practice without departing from the spirit and scope of the present invention as limited solely by the appended claims.

What is claimed is:

1. A control circuit for an output buffer comprising:
   a first input terminal receiving a first enable signal and a second input terminal receiving a second enable signal;
   first and second output terminals to generate first and second partial enable signals to transfer discrete sets of data bits;
   a third input terminal receiving a multiplexer selection control signal;
   one of said first and second input terminals being selected by said multiplexer selection control signal and coupled to said first and second output terminals through a multiplexer;
   a synchronization circuit for linking the partial enable signals operatively to a synchronization signal of the pulse type being synchronous with the loading of the output buffer, said synchronization circuit being connected between an output terminal of said multiplexer and said first and second output terminals of said control circuit.

2. The control circuit unit according to claim 1, wherein said synchronization circuit has a first input terminal receiving the synchronization signal and a second input terminal connected to the output terminal of said multiplexer for receiving a disable signal.

3. The control circuit unit according to claim 2, further comprising a delay circuit connected between a first and a second voltage reference and connected to the output terminal of said multiplexer and to the second input terminal of said synchronization circuit, said delay circuit having a control terminal receiving a reference signal and an output terminal supplying the disable signal.

4. The control circuit unit according to claim 3, wherein said delay circuit comprises an asymmetrical delay network having a significant delay from a first edge of an enable signal and immediate natural propagation at a second edge of said signal.

5. The control circuit unit according to claim 4, wherein said asymmetrical delay network is connected between a first and a second voltage reference and includes an input terminal for receiving a regulating signal, at least a charge control transistor and a delay capacitor connected in series with each other between the first and second voltage references wherein said charge control transistor includes a control terminal connected to the input terminal, and an output terminal supplying a controlled disable signal synchronized to a first edge of the enable signal.

6. The control circuit unit according to claim 5, wherein the controlled disable signal switches from the first edge of the enable signal with a delay which is proportional to a charge or discharge time of the delay capacitor and substantially independent from the first voltage reference, said signal also switching with no or trivial delay from a second edge of the enable signal.

7. The control circuit unit according to claim 5, wherein the delay capacitor is connected to the output terminal by way of a series of first and second logic gates, said second logic gate having an input terminal connected to the output terminal of the multiplexer.

8. The control circuit unit according to claim 5, further comprising first and second enable transistors connected between the charge control transistor and the first and second voltage references, respectively, and including a control terminal connected to the input terminal of the asymmetrical delay network.

9. The control circuit unit according to claim 2, wherein said synchronization circuit has an output terminal supplying a synchronized enable signal to respective first common input terminals of first and second logic circuits, said first and second logic circuits being connected to the first and the second output terminals of the control circuit.

10. The control circuit unit according to claim 9, wherein said first and second logic circuits further include second common input terminals for receiving an enable signal.

11. The control circuit unit according to claim 9, wherein the first and second logic circuits respectively comprise first and second logic gates connected in series with each other between the common input terminals and the first and second output terminals of the control circuit.

12. The control circuit unit according to claim 11, wherein said first logic gate of the logic circuit receives a control signal at an input terminal.

13. The control circuit unit according to claim 1, wherein said synchronization circuit comprises a flip-flop of the SET-RESET type.

14. The control circuit unit according to claim 1, further comprising a logic gate connected between the output terminal of the multiplexer and the first and second output terminals of the control circuit.

15. A method for a synchronous loading of data into an output buffer comprising the steps of:
providing a control circuit receiving first and second enable signals;
providing a multiplexer circuit;
providing a third input terminal for receiving a multiplexer selection control signal;
selecting one of said first and second enable signals by said multiplexer circuit as selected by said multiplexer selection control signal;
generating first and second partial enable signals to transfer data in discrete sets of bits; and
providing a synchronization signal of the pulse type which is synchronous with the output buffer loading and generated by a synchronization circuit to control the partial enable signals.

16. The synchronous data loading method according to claim 15, further comprising the step of providing a delay circuit connected to said synchronization circuit and an asymmetrical delay network which features an immediate reaction to the occurrence of a first data reading cycle and a delayed action with respect to a synchronization circuit disabling operation to thereby produce a filtering action with respect to pulses of noisy origin.

* * * * *